(12) United States Patent
Abe et al.

(10) Patent No.: US 10,354,897 B2
(45) Date of Patent: Jul. 16, 2019

(54) CONTAINER STORAGE FACILITY (71) Applicant: Daifuku Co., Ltd., Osaka-shi (JP)

(72) Inventors: Takeshi Abe, Hinocho (JP); Tadahiro Yoshimoto, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 161 days.

(21) Appl. No.: 15/697,834

(22) Filed: Sep. 7, 2017

(65) Prior Publication Data

US 2018/0076055 A1    Mar. 15, 2018

(30) Foreign Application Priority Data

Sep. 9, 2016 (JP) .................................. 2016-176984

(51) Int. Cl.
| | | |
|---|---|---|
| *B01D 53/02* | (2006.01) | |
| *H01L 21/673* | (2006.01) | |
| *H01L 21/677* | (2006.01) | |
| *H01L 21/67* | (2006.01) | |
| *F01D 11/00* | (2006.01) | |
| *F01B 25/02* | (2006.01) | |

(52) U.S. Cl.
CPC ...... *H01L 21/673* (2013.01); *H01L 21/67017* (2013.01); *H01L 21/67393* (2013.01); *H01L 21/67766* (2013.01); *H01L 21/67769* (2013.01); *H01L 21/67775* (2013.01); *F01B 25/02* (2013.01); *F01D 11/00* (2013.01)

(58) Field of Classification Search
CPC .... F01B 25/02; F01D 11/00; F01L 21/67017; F01L 21/673; F01L 21/67393; F01L 21/67766; F01L 21/67769; F01L 21/67775
See application file for complete search history.

(56) References Cited

U.S. PATENT DOCUMENTS

| 6,363,626 | B1 * | 4/2002 | Fiorillo ............. C23C 16/45561 34/210 |
| 10,239,101 | B2 * | 3/2019 | Murata ..................... B08B 9/08 |
| 2014/0014227 | A1 * | 1/2014 | Shin .................. H01L 21/67772 141/59 |
| 2015/0000789 | A1 * | 1/2015 | Otsuka ............. H01L 21/67393 141/369 |
| 2016/0296984 | A1 * | 10/2016 | Murata ............. H01L 21/67017 |
| 2017/0133254 | A1 | 5/2017 | Murata et al. |
| 2017/0140949 | A1 * | 5/2017 | Onishi .................. H01L 21/673 |
| 2017/0213752 | A1 * | 7/2017 | Ogawa ............. H01L 21/67393 |
| 2018/0229277 | A1 * | 8/2018 | Onishi ..................... B08B 5/02 |

FOREIGN PATENT DOCUMENTS

WO        2015194255 A1    12/2015

* cited by examiner

*Primary Examiner* — Christopher P Jones
(74) *Attorney, Agent, or Firm* — The Webb Law Firm (57) ABSTRACT

A container storage facility has storage portions for storing containers, and supplies a purge gas to the interior of the containers. The container storage facility includes ejection portions that eject the purge gas, a gas supply device that controls the supply flow rate of the purge gas, a main pipe that conducts the purge gas output from the gas supply device, and branch pipes that are branched from the main pipe and are connected to the ejection portions. The ejection portions eject the purge gas regardless of whether or not containers are stored in the storage portions, and the gas supply device controls the supply flow rate of the purge gas so as to increase as the total number of containers stored in the storage portions decreases.

8 Claims, 8 Drawing Sheets

CONTAINER STORAGE FACILITY

CROSS-REFERENCE TO RELATED APPLICATION

This application claims priority to Japanese Patent Application No. 2016-176984 filed Sep. 9, 2016, the disclosure of which is hereby incorporated in its entirety by reference.

FIELD OF THE INVENTION

The present invention relates to a container storage facility that has a plurality of storage portions for storing containers, and that supplies a purge gas to the interior of the stored container in each of the storage portions.

BACKGROUND

WO 2015/194255 discloses a storage facility (purge stocker (1)) that has a mechanism for cleaning the interior of a container with use of a purge gas such as an inert gas or clean dry air (the reference signs in parentheses in this description of background technology are the reference signs used in the prior art document). The purge stocker (1) is provided with a purge device (30) that cleans the interior of a container (F) with use of purge gas. The purge device (30) includes a plurality of loading portions (31), a plurality of supply pipes (33) that are connected to the loading portions (31), a main pipe (41) that is connected to the supply pipes (33), and a mass flow controller (43) that adjusts the flow rate of the purge gas in the main pipe (41) (see paragraph [0029], FIG. 1, etc.).

In a storage facility such as that described above, it is not necessarily the case that containers (F) are always loaded on all of the loading portions (31), and therefore the purge device (30) adjusts the flow rate of the purge gas according to the usage rate of the loading portions (31). The mass flow controller (43) adjusts the flow rate such that when the purge device (30) is to supply the purge gas to the containers (F) at a target supply flow rate (TF), the flow rate is the result of multiplying the number (N) of loaded containers (F) by the target supply flow rate (TF), that is to say TF×N (paragraphs [0034] to [0037]). In other words, the flow rate is adjusted so as to increase as the number of containers (F) that are purge gas supply destinations increases.

In the case where a container (F) is not loaded on a loading portion (31), purge gas leaks out of the supply pipe (33) in that loading portion (31). The mass flow controller (43) adjusts the flow rate (=TF×N) such that the flow rate increases as the number (N) of loaded containers (F) increases. However, in the case where a container (F) is not loaded, purge air is ejected from the supply pipe (33) without resistance from a container (F), and therefore there are cases where relatively more purge gas flows out of that supply pipe (33). As a result, it is conceivable that the flow rate of purge gas supplied to the containers (F) that are loaded on loading portions (31) will fall below the target supply flow rate, and that a sufficient amount of purge air will not supplied to the containers (F). For example, by providing on-off valves (39) in the supply pipes (33) as illustrated in the prior art document, it is possible to suppress the flow of purge air to unoccupied loading portions (31) (see paragraphs [0045] to [0046], FIG. 4, etc.). It should be noted that if an on-off valve (39) is provided in each of the supply pipes (33), the structure becomes complex, the device scale increases, and equipment cost tends to rise.

SUMMARY OF THE INVENTION

In light of the foregoing circumstances, there is desire for the provision of a container storage facility that has a simple structure and that can, regardless of whether or not containers are stored in storage portions for storing containers, stably supply purge gas to the interior of containers that are stored in storage portions.

In light of the foregoing, a container storage facility according to one aspect is a container storage facility that has a plurality of storage portions for storing containers, and that supplies a purge gas to an interior of the container stored in each of the storage portions, the container storage facility including:

an ejection portion provided in each of the storage portions, the ejection portion being capable of being connected to the container stored in the storage portion and ejecting the purge gas into the container;

a gas supply device that controls a supply flow rate of the purge gas;

a main pipe that is connected to the gas supply device and conducts the purge gas output from the gas supply device; and branch pipes that are branched from the main pipe and are connected to the ejection portions, wherein the ejection portions each eject the purge gas regardless of whether or not the container is stored in the storage portion, and the gas supply device acquires information regarding a storage state of the containers in the storage portions, and controls the supply flow rate of the purge gas so as to increase as a total number of containers stored in the storage portions decreases.

According to this configuration, the ejection portions eject the purge gas regardless of whether or not containers are stored in the storage portions, and therefore there is no need to provide control valves or the like in the branch pipes or the ejection portions, and the configuration of the facility can be simplified. Note that when a container is not stored in a storage portion, the purge gas leaks out from the ejection portion, and there is a concern that a sufficient amount of purge gas will not be supplied to the containers that are stored in storage portions. However, according to the above configuration, the gas supply device increases the supply flow rate of the purge gas as the total number of containers stored in the storage portions decreases, and therefore even if the purge gas leaks out from the ejection portions that are not connected to containers, it is possible to supply a sufficient amount of purge gas to stored containers via the ejection portions connected to the containers. In this way, with the above configuration, purge gas can be appropriately supplied to containers through control performed by the gas supply device, without increasing the number of gas supply devices or adding control valves. In other words, according to the above configuration, it is possible to provide a container storage facility that has a simple structure and that can, regardless of whether or not containers are stored in storage portions for storing containers, stably supply purge gas to the interior of containers that are stored in storage portions.

Further features and advantages of the container storage facility will become apparent from the following description of embodiments with reference to the drawings.

DETAILED DESCRIPTION

Figure 1:
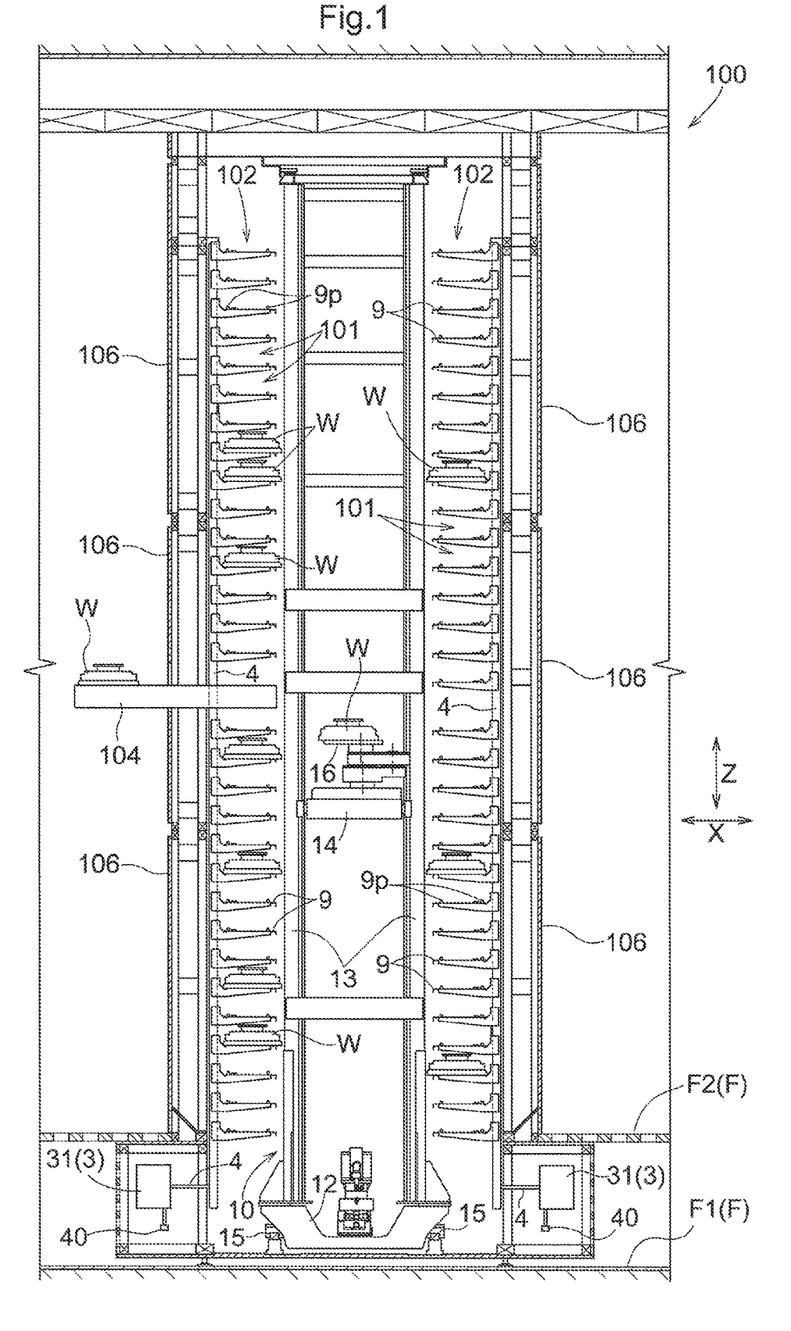
FIG. 1 is a diagram schematically showing a configuration of a container storage facility.
Figure 4:
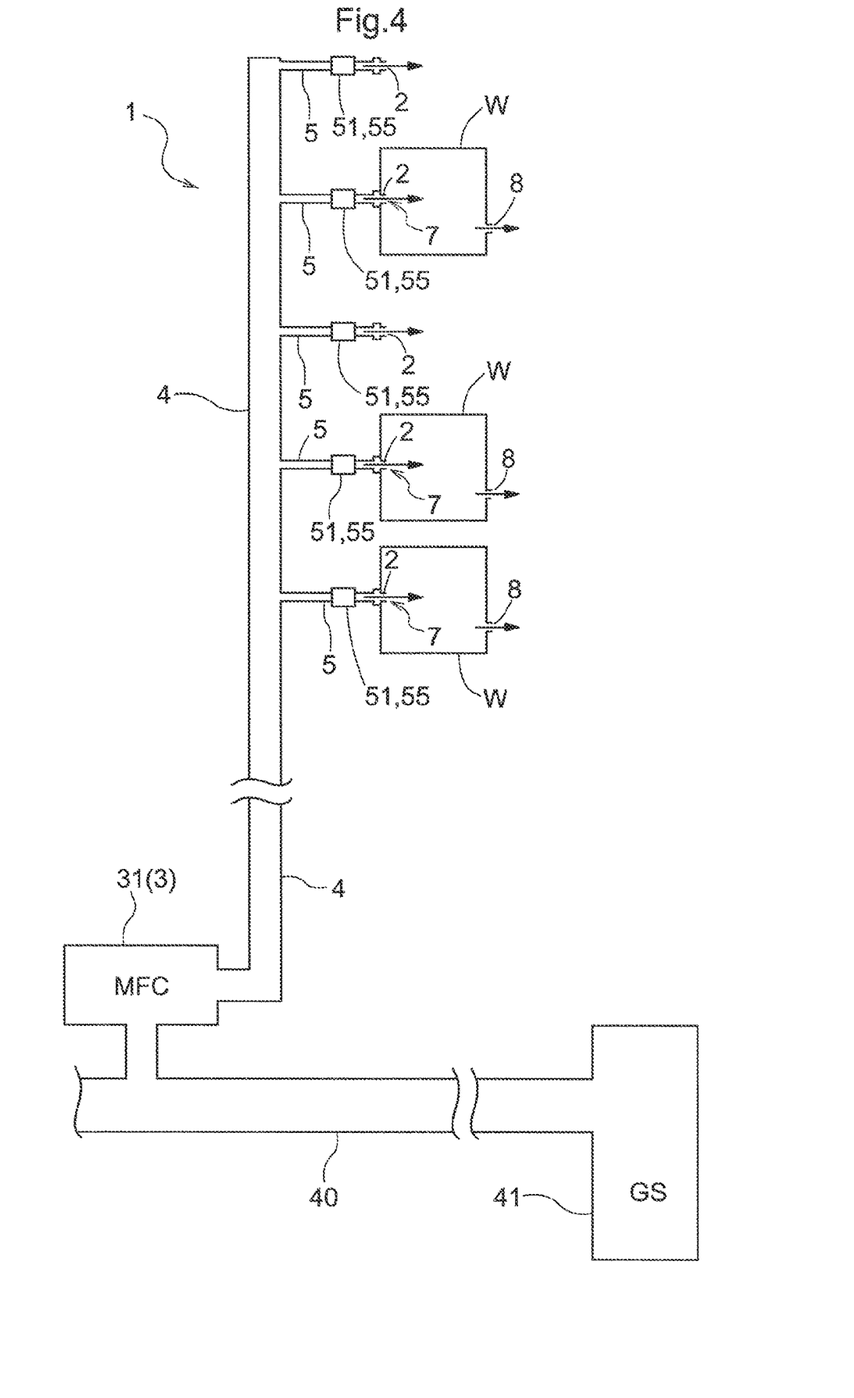
FIG. 4 is a diagram schematically showing a flow path of purge gas in a cleaning device.

Hereinafter, embodiments of a container storage facility will be described with reference to the drawings. FIG. 1 shows an example of a container storage facility 100 that includes container storage racks (storage racks 102) and container transport devices (10, 104, etc.). In the present embodiment, a stacker crane (SC) 10, an overhead hoist vehicle (OHV; see FIG. 5 and the like) 20, and a loading/unloading conveyor 104 are given as examples of container transport devices. The storage racks 102 are provided with a plurality of storage portions 101 for storing containers W. Although described in detail later, a reticle pod for storing a reticle (photomask) is given as an example of the container W in the present embodiment. As shown in FIG. 4, the container storage facility 100 has a cleaning device 1 that supplies a purge gas for filling the containers W. Here, the purge gas is, for example, clean dry air from which dust and moisture have been removed, or an inert gas such as nitrogen gas.

The storage racks 102 are provided as a pair of racks that face each other across a movement path (later-described pair of traveling rails 15) of the stacker crane 10 along masts 13 (vertical supports). Each of the two storage racks 102 is provided with storage portions 101 that are arranged side-by-side in the vertical direction and the rack width direction (direction orthogonal to the paper surface of FIG. 1, and the Y direction in FIG. 3). The storage portions 101 are each provided with a shelf plate 9 on which a stored container W is loaded and supported. The stacker crane 10 includes a traveling carriage 12 that travels along a pair of traveling rails 15, and a pair of masts 13 are provided upright on the traveling carriage 12. A lifter 14 that ascends and descends along the masts 13 is disposed on the masts 13, and the lifter 14 supports a fork 16 that supports a container W and moves toward and away from (the X direction shown in FIG. 1) the storage racks 102.

As shown in FIG. 1, the storage racks 102 are disposed inside an installation space (storage space) that is covered by a wall body 106. The stacker crane 10 transports containers W inside the installation space, and the overhead hoist vehicle 20 transports containers W outside the installation space. The loading/unloading conveyor 104 is disposed so as to pass through the wall body 106, and transports containers W into and out of the installation space. Note that the container storage facility 100 is disposed inside a clean room. A blower fan (not shown) that blows a gas such as clean dry air downward for example is disposed directly above the installation space (storage space), thus forming a down-flow type of clean room in which a gas flows from the ceiling toward the floor.

A floor portion F of the clean room is constituted by a lower floor portion F1 and an upper floor portion F2 that is arranged at a higher position than the lower floor portion F1. The upper floor portion F2 is a grating floor provided with air holes that penetrate in the vertical direction. For example, workers walk on the upper floor portion F2. The lower floor portion F1 is a floor that does not have air holes, and in the present embodiment, the lower floor portion F1 is constituted by concrete that does not have holes. The stacker crane 10 travels along traveling rails 15 that are installed on the lower floor portion F1 or are installed on a floor plate member that is fixed to the lower floor portion F1.

The loading/unloading conveyor 104 carries and transports containers W between an external transfer position that is located outside the wall body 106 and an internal transfer position that is located inside the wall body 106. The overhead hoist vehicle 20 loads and unloads containers W at the external transfer position of the loading/unloading conveyor 104 shown in FIG. 1. In the present embodiment, although not shown, a lower loading/unloading conveyor that passes through the wall body 106 may be provided at a lower position than the loading/unloading conveyor 104, such as a position of being supported by the upper floor portion F2 (in this case, the loading/unloading conveyor 104 is called the upper loading/unloading conveyor). Workers load and unload containers W at the external transfer position of the lower loading/unloading conveyor disposed at a relatively lower position.

When a container W is loaded at the external transfer position of the loading/unloading conveyor 104 (including the lower loading/unloading conveyor as well), the container W is transported from the external transfer position to the internal transfer position by the loading/unloading conveyor 104. The stacker crane 10 transports the container W from the internal transfer position to a storage portion 101, and places (loads) the container W on the shelf plate 9 of the storage portion 101. Conversely, the stacker crane 10 retrieves a container W from the shelf plate 9 of a storage portion 101, and transports the container W to the internal transfer position of the loading/unloading conveyor 104 (including the lower loading/unloading conveyor as well). This container W is then carried and transported from the internal transfer position to the external transfer position by the loading/unloading conveyor 104, and then removed (unloaded) at the external transfer position by the overhead hoist vehicle 20 or a worker. In other words, the stacker crane 10 transports containers W between the internal transfer position and a storage portion 101.

Figure 2:
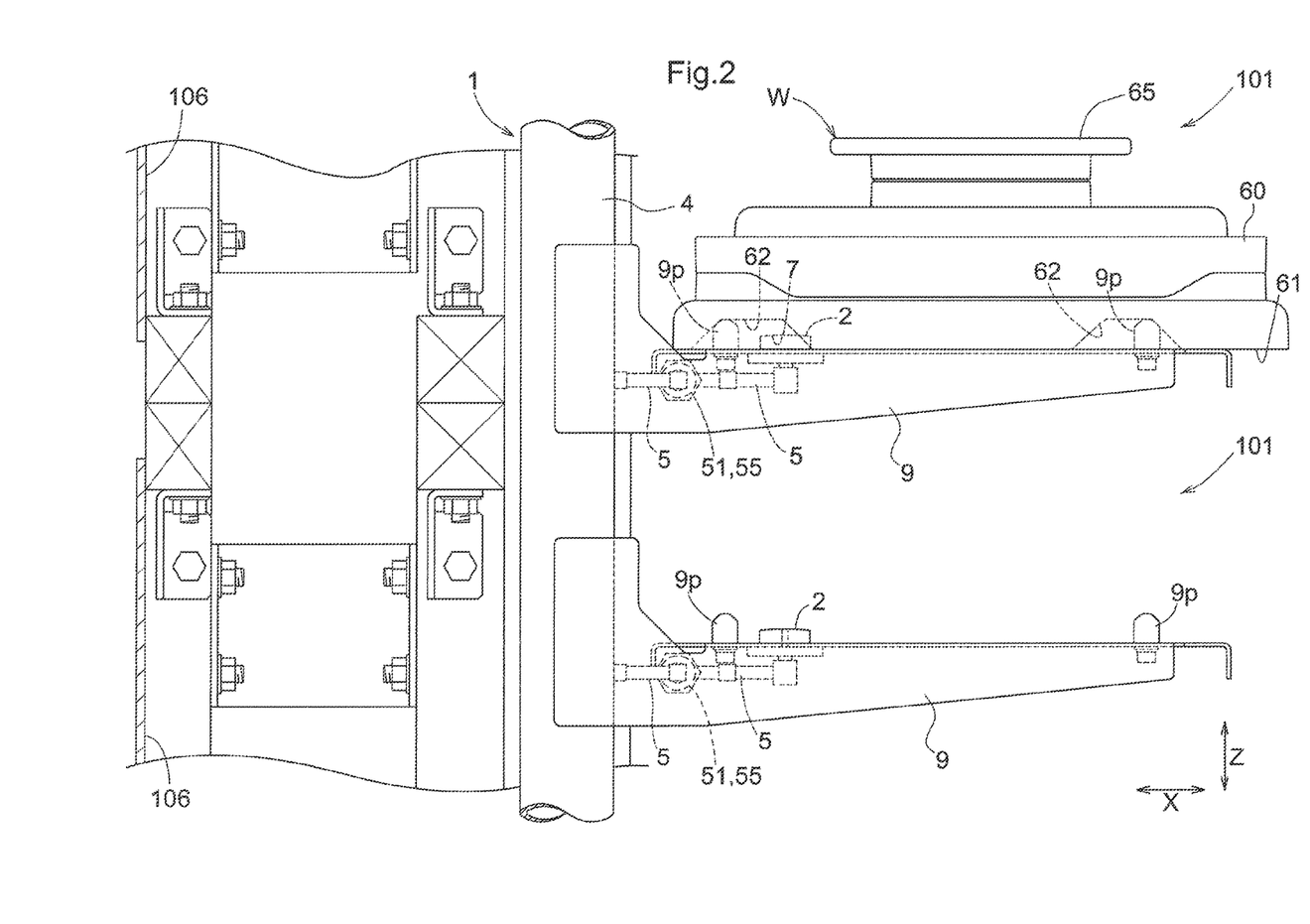
FIG. 2 is a side view of a storage portion.
Figure 3:
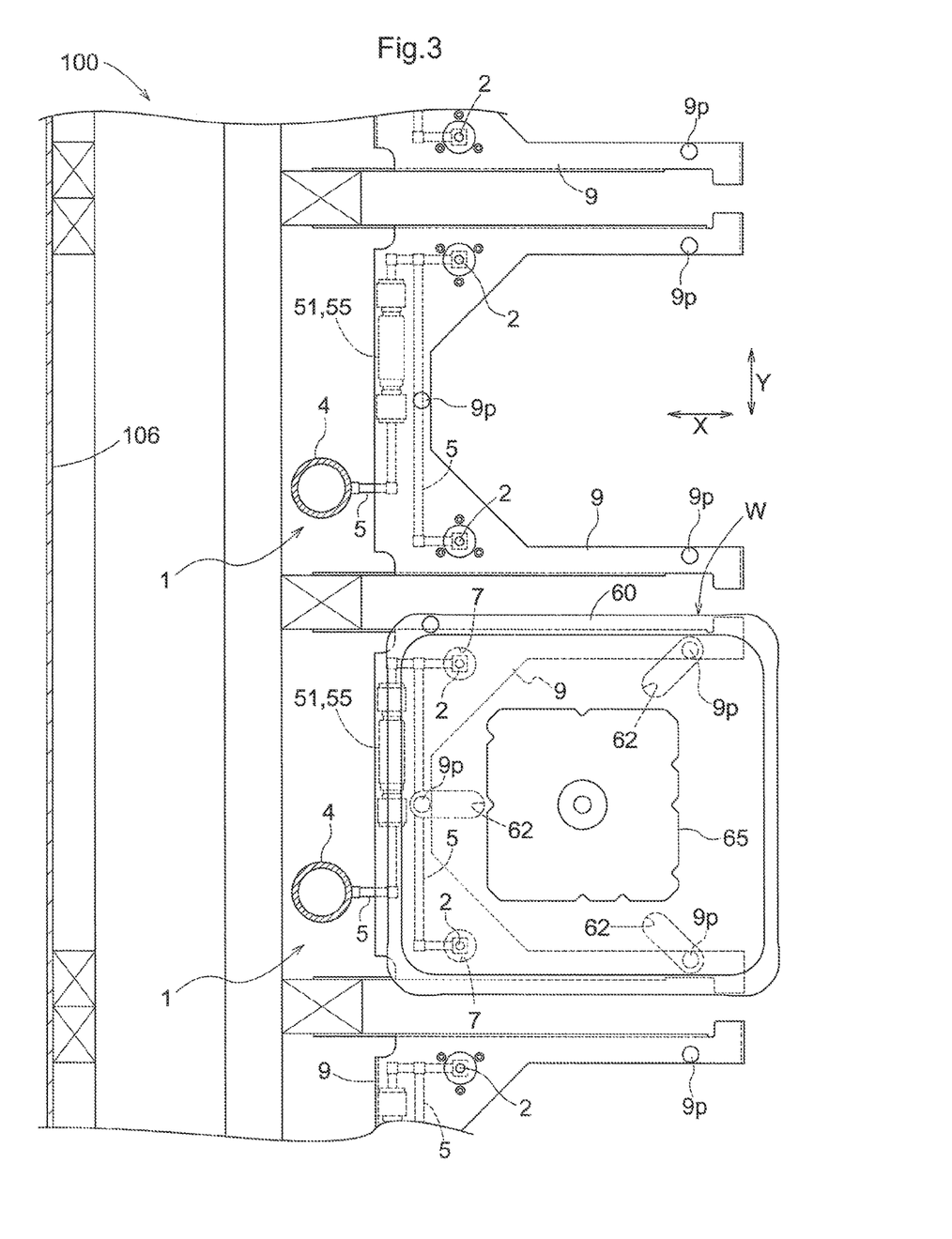
FIG. 3 is a top view the storage portion.

As described above, in the present embodiment, the container W is a reticle pod. As shown in FIGS. 2 and 3, the container W has a container main body portion 60 for storing a reticle, and a flange portion 65 that is provided on the upper end portion of the container W and is located higher than the container main body portion 60. The overhead hoist vehicle 20 suspends and supports the container W by gripping the flange portion 65, and transports the container W in this state. Also, the stacker crane 10 transports the container W in the state where a bottom surface 61 of the container main body portion 60 is placed on and supported by a fork 16 (container supporting portion) (see FIG. 1).

As shown in FIGS. 2 and 3, a bottom recessed portion 62 that is recessed upward in a vertical direction Z is provided at three locations in the bottom surface 61 of the container main body portion 60 (bottom surface 61 of the container W). The bottom recessed portion 62 has a tapered shape that becomes narrower in the upward direction, and the inner surfaces of the bottom recessed portion 62 are inclined surfaces. A shelf plate positioning pin 9p provided on the shelf plate 9 of the storage portion 101 and a fork positioning pin (not shown) provided on the fork 16 of the stacker crane 10 engage with the bottom recessed portion 62 from below. When the container W is placed on the shelf plate 9 and scooped up by the fork 16, even if the position of the container W deviates in the horizontal direction, the positioning pins are guided by the inner surfaces of the bottom recessed portion 62. Accordingly, the horizontal position of the container W relative to the fork 16 and the shelf plate 9 is corrected to an appropriate position.

As shown in FIGS. 2 and 3, the shelf plate 9 of the storage rack 102 is fixed to the frame of the storage rack 102 in a cantilevered orientation in which one side is supported in a fixed manner and the other side is free. The shelf plate 9 is not rectangular, but rather is U-shaped, and supports three sides of the bottom surface 61 of the rectangular container W. Three shelf plate positioning pins 9p are arranged at three locations on the shelf plate 9, namely the bottom portion and the two side portions of the U shape. As described above, when the container W is placed on the shelf plate 9, the three shelf plate positioning pins 9p respectively engage with the three bottom recessed portions 62 in the container W, and thus the container W is appropriately placed on the shelf plate 9.

Figure 5:
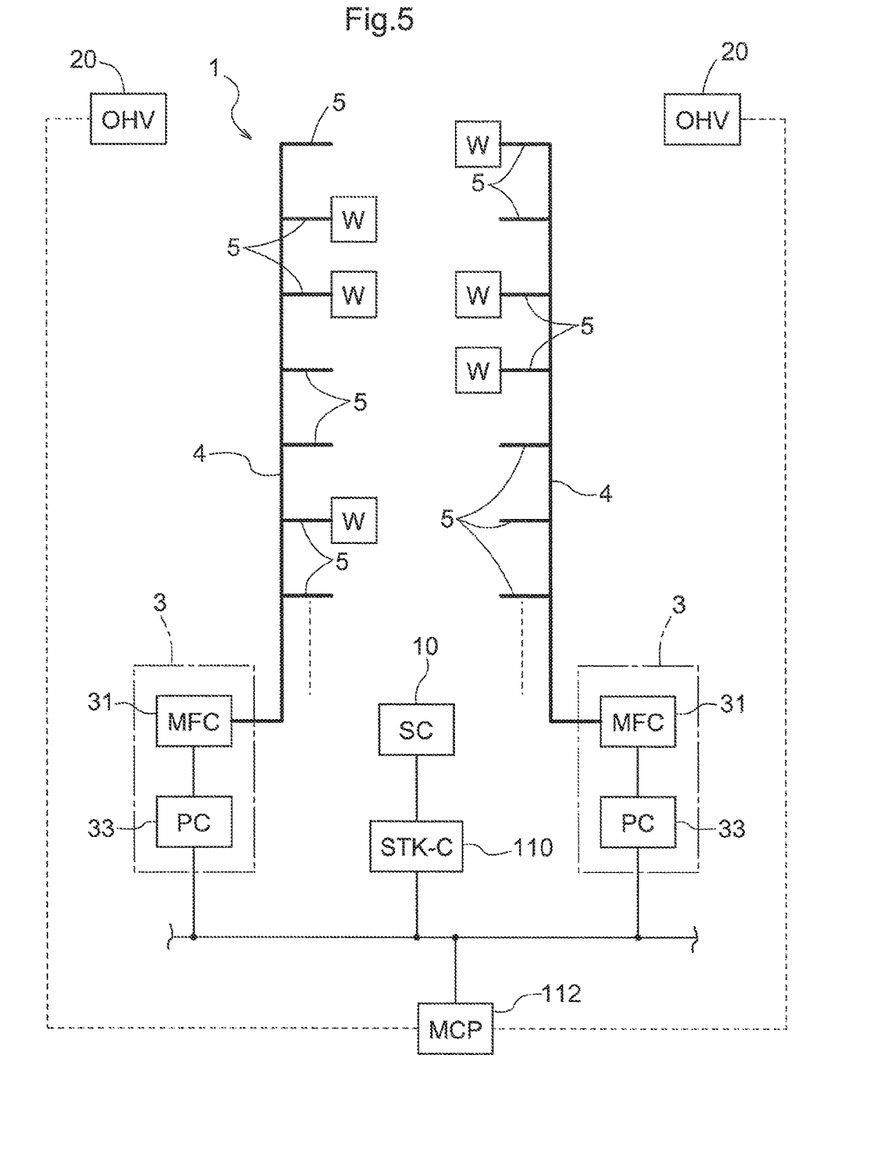
FIG. 5 is a schematic block diagram showing a configuration of the container storage facility that includes the cleaning device.

The container storage facility 100 of the present embodiment includes the cleaning device 1 that supplies purge gas to the interior of the container W stored in each of the storage portions 101. The following description is given with reference to FIGS. 4 and 5 as well. The cleaning device 1 includes ejection portions 2 that eject purge gas into containers W, gas supply devices 3 that control the supply flow rate of purge gas, main pipes 4 that conduct purge gas output from the gas supply devices 3, and branch pipes 5 that branch off from the main pipes 4 and are connected to respective ejection portions 2. As shown in FIG. 5 and the like, the gas supply devices 3 each include a mass flow controller (MFC) 31 and a purge controller (PC) 33. The mass flow controller 31 receives purge gas from a gas source (GS) 41 via a main 40. Note that although not shown in FIG. 5 and the like, a host purge controller that performs overall management of a plurality of purge controllers 33 may be provided.

The ejection portions 2 are respectively connected to the containers W stored in the storage portions 101, and eject purge gas in the containers W. As shown in FIG. 4, each container W is provided with a gas inlet 7 and a gas outlet 8. Although not shown in FIGS. 2 and 3, the gas inlet 7 and the gas outlet 8 are formed in the bottom surface 61 of the container W, for example. As described above with reference to FIGS. 2 and 3, three shelf plate positioning pins 9p are provided on the shelf plate 9 of each storage portion 101, and the container W is appropriately placed on the shelf plate 9 due to the shelf plate positioning pins 9p respectively engaging with the three bottom recessed portions 62 of the container W. As shown in FIGS. 2 and 3, the ejection portion 2 is also provided so as to project upward from the shelf plate 9 similarly to the shelf plate positioning pins 9p. The ejection portion 2 is connected to the gas inlet 7 of the container W in the state where the container W is appropriately placed on and supported by the shelf plate 9 at a defined position.

The purge gas ejected from the ejection portion 2 flows into the container W via the gas inlet 7. The gas inlet 7 is provided with an inlet on-off valve (not shown), and the gas outlet 8 is provided with an outlet on-off valve (not shown). The inlet on-off valve and the outlet on-off valve are biased in the off state by a biasing body such as a spring. When the ejection portion 2 is connected to the gas inlet 7, and purge gas is ejected from the ejection portion 2, the inlet on-off valve opens due to the pressure of the purge gas, and the purge gas is supplied from the gas inlet 7 to the interior of the container W. Also, as the purge gas is supplied and the pressure inside the container W rises, the outlet on-off valve opens due to the pressure of the purge gas, and the gas inside the container W (air or moist air, and the purge gas already filling the container, etc.) are expelled from the gas outlet 8. Note that the container W is configured to be able to enter an air-tight state. Specifically, it is configured such that when the connection between the ejection portion 2 and the gas inlet 7 is cut off and the container W is transported by the container transport device (10, 20, 104), the purge gas inside the container W does not readily leak out.

The storage rack 102 includes a plurality of storage portions 101, but it is not necessarily the case that containers W are always stored in all of the storage portions 101. The ejection portion 2 provided in each storage portion 101 is open even when a container W is not stored in the storage portion 101 and the ejection portion 2 is not connected to the gas inlet 7 of the container W, and thus purge gas flows out of the ejection portion 2 (see FIG. 4). If the resistance when purge gas flows out of the ejection portion 2 in the open state is smaller than the resistance when purge gas is supplied from the gas inlet 7 to the interior of the container W, a large amount of purge gas is ejected from the ejection portion 2 in the open state. As a result, there are cases where the flow rate of purge gas supplied to the interior of the containers W is insufficient, and the containers W are not sufficiently cleaned.

In view of this, in the present embodiment, the gas supply device 3 acquires information regarding the storage state of containers W in the storage portions 101, and controls the supply flow rate of purge gas according the total number "n" of containers W stored in the storage portions 101. Specifically, the gas supply device 3 controls the supply flow rate "FL" of purge gas such that the lower the total number "n" of containers W stored in the storage portions 101 is, that is to say, the lower the usage rate of the storage portions 101 is, the higher the supply flow rate is. Note that as shown in FIG. 4, there are cases where a group of branch pipes 5 and a group of ejection portions 2 that receive purge gas from the same mass flow controller 31 and main pipe 4 are respectively called a "branch pipe group" and an "ejection portion group", and the group of storage portions 101 provided with the group of ejection portions is called a "storage portion group". In this case, the gas supply device 3 controls the supply flow rate "FL" of purge gas such that the lower the total number "n" of containers W stored in a storage portion group is, that is to say, the lower the usage rate of the storage portion group is, the higher the supply flow rate is.

As shown in FIG. 1, in the present embodiment, a plurality of storage portions 101 (storage portion group) are arranged side-by-side in the vertical direction Z so as to overlap each other in a view in a direction along the vertical direction Z. The mass flow controller 31 is arranged lower than the storage portions 101 (storage portion group) in the vertical direction Z, at a position not overlapped by the storage portions 101 (storage portion group) in a view in a direction along the vertical direction Z. In the present embodiment, the mass flow controller 31 is arranged lower than all of the storage portions 101 that are purge gas supply targets. In other words, the mass flow controller 31 is arranged at a position not overlapped by the storage portions 101 in a view along the horizontal directions (X direction and Y direction). As described above, the floor portion F of the clean room is constituted by the lower floor portion F1 and the upper floor portion F2 that is arranged at a higher position than the lower floor portion F1. The storage portion 101 at the lowest position in the vertical direction Z is not arranged below the upper floor portion F2, and all of the storage portions 101 (the entire storage portion group) are arranged above the upper floor portion F2. In other words, the mass flow controller 31 is arranged below the upper floor portion F2 in consideration of the weight of the device and the arrangement of the gas source 41 and the main 40 as well. Note that out of the mass flow controllers 31 and the purge controllers 33 included in the gas supply device 3, at least the mass flow controllers 31 are arranged below the upper floor portion F2.

The mass flow controllers 31 that output purge gas toward the main pipes 4 often generate a large amount of heat. Here, it is preferable that the application of heat is suppressed in the case where the contents stored in the containers W are semiconductor materials (wafers) or semiconductor manufacturing materials (reticles (photomasks)). In particular, semiconductor manufacturing materials in increasingly miniaturized advanced processes, such as EUV (Extreme Ultraviolet Lithography) masks, are readily influenced by heat. If the mass flow controller 31 is arranged directly below storage portions 101 (storage portion group) that are arranged side-by-side so as to overlap in a view in a direction along the vertical direction Z, there are cases where warm air rises upward and raises the temperature of the storage portions 101 and the containers W stored in the storage portions 101, and furthermore the reticles (photomasks) or the like stored in the containers W. By arranging the mass flow controller 31 at a position away from directly below the storage portions 101 as in the present embodiment, it is possible to suppress this application of heat.

As described above, the container storage facility 100 of the present embodiment is configured as a down flow type of clean room in which air flows from the ceiling toward the floor, but there are cases where regions with a weak down flow appear. If the down flow is weak above the location where the mass flow controller 31 is disposed, there is concern that warm air will readily rise and raise the temperature of the containers W and the contents of the containers W. Accordingly, it is preferable that the mass flow controller 31 is not arranged in a region where the down flow is weak. In the case of the vertical direction Z in which the storage portions 101 are arranged side-by-side, the down flow is hindered by the storage portions 101, and thus the down flow readily becomes weak. Accordingly, it is preferable that the mass flow controller 31 is arranged at a position away from a position directly below the storage portions 101.

FIG. 5 schematically shows the system configuration of the container storage facility 100 that includes the cleaning device 1. The transport and storage of containers W in the container storage facility 100 is controlled by a stacker crane controller (STK-C) 110 and a material control processor (MCP) 112. Note that in the case where a host purge controller that performs overall management of a plurality of purge controllers 33 is provided as described above, the transport and storage of containers W and the supply of purge gas in the container storage facility 100 may be controlled by cooperation between the material control processor 112 and the host purge controller, or by cooperation between the host purge controller and a host transport management device that corresponds to the material control processor 112.

In the present embodiment, as shown in FIG. 5, one gas supply device 3 is provided for each storage rack 102. Each mass flow controller 31 is connected to the main 40 shown in FIG. 4 and the main pipe 4 provided in the corresponding storage rack 102, and adjusts the supply flow rate of purge gas that is supplied to the main pipe 4. The supply flow rate for each main pipe 4 is determined by the purge controller 33 that is provided for the corresponding mass flow controller 31. The transport and storage of containers W is managed by management devices such as the stacker crane controller 110 and the material control processor 112. In particular, in the present embodiment, the stacker crane 10 performs the loading and unloading of containers W to and from the storage portions 101, and therefore the usage state of the storage portions 101 is known by the stacker crane controller 110. Accordingly, in the present embodiment, each purge controller 33 acquires, from the stacker crane controller 110 via a local network or the like, the usage state of the storage portions 101 (group of storage portions) in the corresponding storage rack 102 (the total number "n" of containers W that are stored in the storage portions 101).

The purge controller 33 controls the supply flow rate "FL" of purge gas so as to increase as the total number "n" of containers W stored in the storage portions 101 decreases. As one aspect, letting "N" be the total number of ejection portions 2 (ejection portion group) that are connected to the main pipe 4 via branch pipes 5 (branch pipe group), "n" be the total number of containers W that are stored in the storage portions 101 (storage portion group), "Fa" be a reference flow rate of purge gas output from the mass flow controller 31 (gas supply device 3), "Fb" be an offset flow rate that indicates an offset value of purge gas output from the mass flow controller 31 (gas supply device 3), and "FL" be the supply flow rate of purge gas output from the mass flow controller 31 (gas supply device 3), the purge controller (gas supply device 3) controls the supply flow rate "FL" such that "FL=(N/n)·Fa+Fb" holds true.

Figure 6:
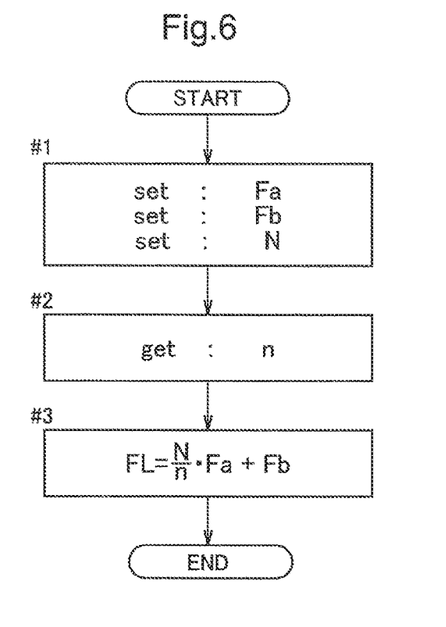
FIG. 6 is a flowchart showing an example of supply flow rate control.

As shown in the flowchart of FIG. 6, the purge controller 33 sets basic parameters (reference flow rate "Fa", offset flow rate "Fb", and total number "N" of ejection portions 2), which are stored in a program memory or a parameter register, in an operation register (step #1). Note that the basic parameters may be acquired from the stacker crane controller 110 (management device). Next, the purge controller 33 acquires, from the stacker crane controller 110, the total number "n" of containers W that are stored in the storage portions 101 (step #2). The acquired total number "n" is also set in the operation register. The purge controller 33 then uses the parameters set in the operation register to calculate the supply flow rate "FL" based on the pre-programmed algorithm "FL=(N/n)·Fa+Fb".

Figure 7:
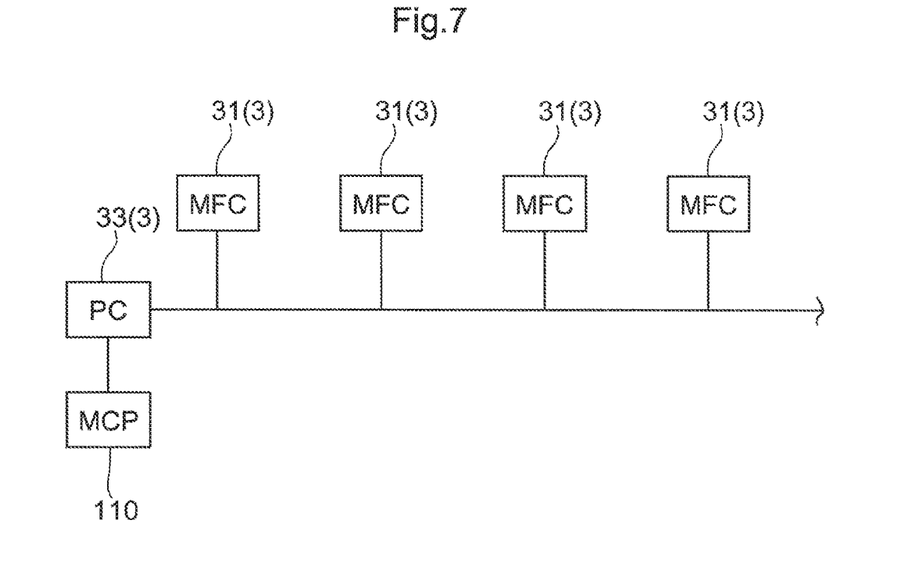
FIG. 7 is a schematic block diagram showing an example of another configuration of a gas supply device.

Note that although an aspect in which a purge controller 33 is provided for each mass flow controller 31 as shown in FIG. 5 is described above, an aspect is possible in which, as shown in FIG. 7, one purge controller 33 is provided for a plurality of mass flow controllers 31. Specifically, an aspect is possible in which one purge controller 33 calculates supply flow rates "FL" for a plurality of mass flow controllers 31, and transmits the supply flow rates to the mass flow controllers 31.

There are cases where the resistance value when supplying purge gas to a container W is not constant, but rather changes depending on the type of container W and the manufacturer. Also, even with the same type of container W, there are cases where the resistance value changes due to individual differences or change over time (e.g., differences arise in the biasing force of the inlet on-off valve and the outlet on-off valve, or differences arise in air-tightness). If there is a large difference in resistance value between containers W, there are cases where even when the supply flow rate "FL" is controlled according to the number "n" of stored containers W, a sufficient amount of purge gas cannot be supplied to the containers W. In view of this, if the resistance value when purge gas flows through each branch pipe 5 and is ejected from the ejection portion 2 is set within a certain range, the influence of the resistance value of the container W is suppressed, and it is possible to unify the amount of purge gas that is ejected from the ejection portions 2.

Figure 8:
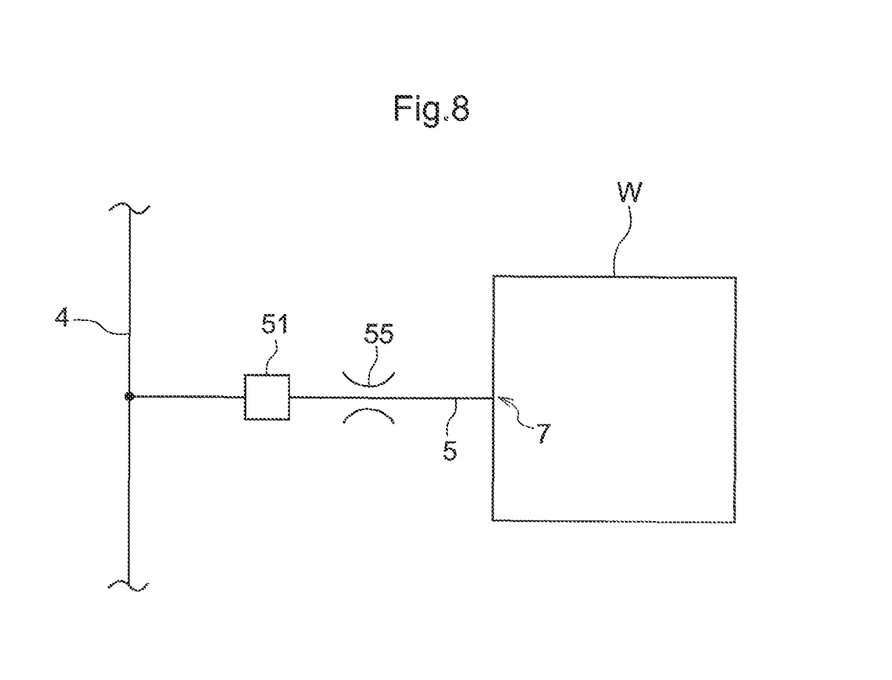
FIG. 8 is a diagram schematically showing an example of another configuration of branch pipes.
Figure 9:
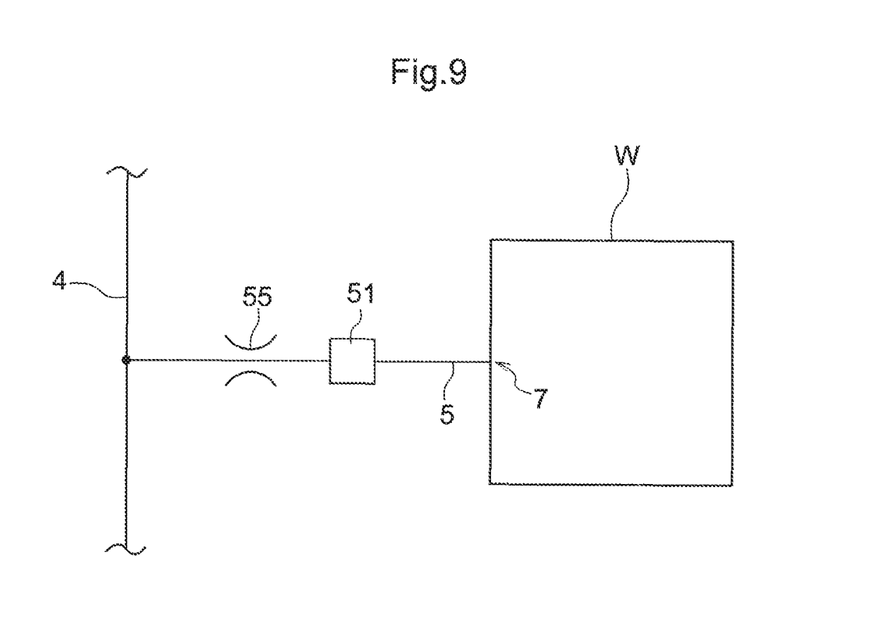
FIG. 9 is a diagram schematically showing an example of another configuration of branch pipes.

FIGS. 8 and 9 show aspects in which an orifice 55 is provided as a flow resistance body in a branch pipe 5. Note that FIGS. 8 and 9 show examples in which a dust filter 51 that removes dust contained in the purge gas is also provided. The dust filter 51 also hinders the flow of purge gas, and the dust filter 51 can also be a flow resistance body. The dust filter 51 may be used as a flow resistance body instead of the orifice 55, or the flow resistance body may be constituted by the orifice 55 and the dust filter 51. It is preferable that the resistance value of the flow resistance body is larger than the inflow resistance, which is the resistance component when purge gas flows from the gas inlet 7 into the container W.

Note that FIG. 8 shows an aspect in which the dust filter 51 is provided upstream of the orifice 55, and FIG. 9 shows an aspect in which the dust filter 51 is provided downstream of the orifice 55. If the orifice 55 is provided, there are cases where the flow speed increases due to the venturi effect, and noise is produced downstream of the orifice 55. If the dust filter 51 is provided downstream of the orifice 55 as shown in FIG. 9, it is possible that noise will be suppressed by the dust filter 51. The orifice 55 and the dust filter 51 may be arranged in either order, but it is preferable that the order is set with consideration given to noise and the like as well.

[Other Embodiments] Hereinafter, other embodiments will be described. Note that the configurations in the embodiments described below are not limited to being applied on their own, and can also be applied in combination with the configurations of other embodiments as long as no contradiction arises.

(1) A reticle pod is described above as the container W that is the purge gas supply target. However, the container W may be an FOUP (Front Opening Unified Pod) for storing a plurality of semiconductor wafers. Also, the container W may store a food product or the like.

(2) In the aspect described above, the stacker crane controller 110 manages the usage rate of the storage portion group (the total number "n" of containers W stored in the storage portions 101), and the purge controller 33 acquires this total number "n" from the stacker crane controller 110. However, an aspect is possible in which the storage portions 101 are provided with a storage sensor (not shown) that detects whether or not a container W exists, and the purge controller 33 acquires (calculates) the total number "n" based on detection results from the storage sensors. In the example described above, in consideration of a rise in cost due to providing storage sensors and a rise in the temperature of the containers W due to heat generated by storage sensors, such storage sensors are not provided, and the total number "n" is acquired from the stacker crane controller 110. However, this does not preclude the usage of storage sensors.

(3) In the aspect described above, the mass flow controller 31 is arranged lower than all of the storage portions 101 in the vertical direction Z. However, the mass flow controller 31 may be arranged lower than a portion of the storage portions 101. Specifically, an aspect is possible in which the storage portions 101 are arranged side-by-side in the vertical direction Z so as to overlap each other in a view in a direction along the vertical direction Z, and the mass flow controller 31 is arranged lower than at least a portion of the storage portions 101 in the vertical direction Z without being overlapped by the storage portions 101 in a view in a direction along the vertical direction Z.

(4) In the aspect described above, the mass flow controller 31 is arranged at a position away from a position directly below the storage portions 101. However, in the case where a rise in the temperature of the containers W and the storage content of the containers W does not need to be given consideration, or in the case where heat can be blocked, the mass flow controller 31 may be arranged directly below the storage portions 101.

Figure 10:
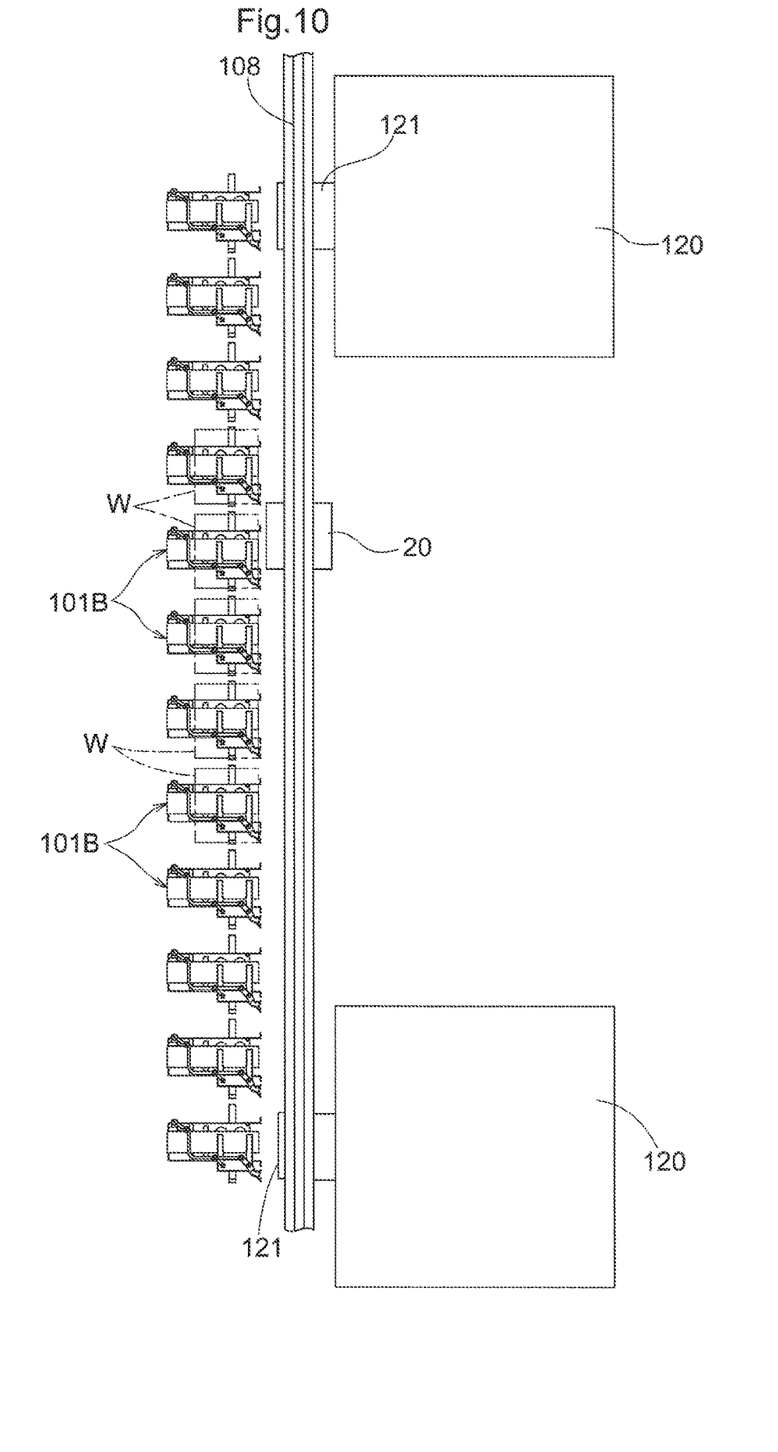
FIG. 10 is a plan view schematically showing an example of another arrangement of storage portions.

(5) In the aspect described above, a plurality of storage portions 101 are arranged side-by-side in the vertical direction Z so as to not overlap each other in a view in a direction along the vertical direction Z. However, the storage portions 101 may be arranged side-by-side so as to overlap each other in a view in a direction along a horizontal direction, as with second storage portions 101B show in FIG. 10. The second storage portions 101B are arranged side-by-side in a horizontal direction along a ceiling rail 108 that extends in the horizontal direction between a plurality of semiconductor processing devices 120. An overhead hoist vehicle 20 moves along the ceiling rail 108 and performs the transfer and transport of containers W to and from loading/unloading stations 121 of the semiconductor processing devices 120, and to and from the second storage portions 101B.

[Overview of Embodiments] The following briefly describes an overview of the container storage facility described above.

In one aspect, the container storage facility is a container storage facility that has a plurality of storage portions for storing containers, and that supplies a purge gas to an interior of the container stored in each of the storage portions, the container storage facility including:

an ejection portion provided in each of the storage portions, the ejection portion being capable of being connected to the container stored in the storage portion and ejecting the purge gas into the container;

a gas supply device that controls a supply flow rate of the purge gas;

a main pipe that is connected to the gas supply device and conducts the purge gas output from the gas supply device; and branch pipes that are branched from the main pipe and are connected to the ejection portions, wherein the ejection portions each eject the purge gas regardless of whether or not the container is stored in the storage portion, and the gas supply device acquires information regarding a storage state of the containers in the storage portions, and controls the supply flow rate of the purge gas so as to increase as a total number of containers stored in the storage portions decreases.

According to this configuration, the ejection portions eject the purge gas regardless of whether or not containers are stored in the storage portions, and therefore there is no need to provide control valves or the like in the branch pipes or the ejection portions, and the configuration of the facility can be simplified. Note that when a container is not stored in a storage portion, the purge gas leaks out from the ejection portion, and there is a concern that a sufficient amount of purge gas will not be supplied to the containers that are stored in storage portions. However, according to the above configuration, the gas supply device increases the supply flow rate of the purge gas as the total number of containers stored in the storage portions decreases, and therefore even if the purge gas leaks out from the ejection portions that are not connected to containers, it is possible to supply a sufficient amount of purge gas to stored containers via the ejection portions connected to the containers. In this way, with the above configuration, purge gas can be appropriately supplied to containers through control performed by the gas supply device, without increasing the number of gas supply devices or adding control valves. In other words, according to the above configuration, it is possible to provide a container storage facility that has a simple structure and that can, regardless of whether or not containers are stored in storage portions for storing containers, stably supply purge gas to the interior of containers that are stored in storage portions.

It is preferable that letting N be a total number of ejection portions that are connected to the main pipe via the branch pipes, n be a total number of containers stored in the storage portions, Fa be a reference flow rate of the purge gas output from the gas supply device, Fb be an offset flow rate indicating an offset value of the purge gas output from the gas supply device, and FL be the supply flow rate of the purge gas output from the gas supply device, the gas supply device controls the supply flow rate such that $FL=(N/n) \cdot Fa+Fb$ holds true.

According to this configuration, in the case where containers are stored in all of the storage portions that are connected to the main pipe, "n=N". In this case, the gas supply device can appropriately supply the purge gas to the containers by outputting the purge gas at a supply flow rate that is based on the reference flow rate and the offset flow rate. However, in the case where storage portions not storing containers exist among the storage portions that are connected to the main pipe, as the number of stored containers decreases, the denominator in "N/n" decreases, and the multiplier coefficient applied to the reference flow rate increases. In other words, as the number of stored containers decreases, the supply flow rate increases. Accordingly, even if the purge gas leaks out from ejection portions that are not connected to containers, it is possible to supply a sufficient amount of purge gas to stored containers via the ejection portions connected to the containers. According to the above configuration, using a simple linear calculation, it is possible to stably supply the purge gas to the containers regardless of whether or not containers are stored in the storage portions.

In another aspect, it is preferable that the ejection portions can be connected to a gas inlet of the containers, and the branch pipes are each provided with a flow resistance body that has a higher resistance value than an inflow resistance that is a resistance component when the purge gas flows into a container via the gas inlet.

There are cases where the resistance value when supplying purge gas to a container is not constant, but rather changes depending on the type of container and the manufacturer. Also, even with the same type of container, there are cases where the resistance value changes due to individual differences, change over time, or the like. If there is a large difference in resistance value between containers, there are cases where even when the supply flow rate is controlled according the number of stored containers, a sufficient amount of purge gas cannot be supplied to the containers. According to the above configuration, the flow resistance body having a resistance value higher than the inflow resistance is provided in each of the branch pipes, thus suppressing the influence of the resistance value of the container, and making it possible to unify the amount of purge gas that is ejected from the ejection portions. As a result, control of the supply flow rate is performed effectively according to the number of stored containers, and it is possible to stably supply the purge gas to the containers regardless of whether or not containers are stored in the storage portions.

In another aspect, it is preferable that the storage portions are arranged side-by-side in a vertical direction so as to overlap each other in a view in a direction along the vertical direction, and the gas supply device is arranged lower than the storage portions in the vertical direction without being overlapped by the storage portions in a view in a direction along the vertical direction.

A gas supply device that outputs a purge gas to a main pipe often generates a large amount of heat due to having a compressor or the like. Here, if the content stored in the containers is a semiconductor material or a semiconductor manufacturing material, for example, the content is easily influenced by heat. Also, the gas supply device is often arranged at the bottom of the container storage facility, for example on the floor, in consideration of the weight of the gas supply device and the arrangement of the purge gas supply source and pipe connected to the supply source. Here, if the gas supply device is arranged at a position directly below storage portions that are arranged side-by-side so as to overlap each other in a view in a direction along the vertical direction, it is conceivable that warm air will rise upward and raise the temperature of the storage portions and the containers stored in the storage portions. By arranging the gas supply device at a position away from a position directly below the storage portions as in the above configuration, it is possible to suppress the above-described heating.

The invention claimed is:

1. A container storage facility that has a plurality of storage portions for storing containers, and that supplies a purge gas to an interior of the container stored in each of the storage portions, the container storage facility comprising:
   an ejection portion provided in each of the storage portions, the ejection portion being capable of being connected to the container stored in the storage portion and ejecting the purge gas into the container;
   a gas supply device that controls a supply flow rate of the purge gas;
   a main pipe that is connected to the gas supply device and conducts the purge gas output from the gas supply device; and
   branch pipes that are branched from the main pipe and are connected to the ejection portions,
   wherein the ejection portions each eject the purge gas regardless of whether or not the container is stored in the storage portion, and
   wherein the gas supply device acquires information regarding a storage state of the containers in the storage portions, and controls the supply flow rate of the purge gas so as to increase as a total number of containers stored in the storage portions decreases.

2. The container storage facility according to claim 1, wherein the gas supply device controls the supply flow rate according to the formula:

$$FL=(N/n) \cdot Fa+Fb$$

wherein:
N is a total number of ejection portions that are connected to the main pipe via the branch pipes,
n is a total number of containers stored in the storage portions,
Fa is a reference flow rate of the purge gas output from the gas supply device,
Fb is an offset flow rate indicating an offset value of the purge gas output from the gas supply device, and
FL is the supply flow rate of the purge gas output from the gas supply device.

3. The container storage facility according to claim 1, wherein the ejection portions can be connected to a gas inlet of the containers, and
wherein the branch pipes are each provided with a flow resistance body that has a higher resistance value than an inflow resistance that is a resistance component when the purge gas flows into a container via the gas inlet.

4. The container storage facility according to claim 2, wherein the ejection portions can be connected to a gas inlet of the containers, and
wherein the branch pipes are each provided with a flow resistance body that has a higher resistance value than an inflow resistance that is a resistance component when the purge gas flows into a container via the gas inlet.

5. The container storage facility according to claim 1, wherein the storage portions are arranged side-by-side in a vertical direction so as to overlap each other in a view in a direction along the vertical direction, and the gas supply device is arranged lower than the storage portions in the vertical direction without being overlapped by the storage portions in a view in a direction along the vertical direction.

6. The container storage facility according to claim 2, wherein the storage portions are arranged side-by-side in a vertical direction so as to overlap each other in a view in a direction along the vertical direction, and the gas supply device is arranged lower than the storage portions in the vertical direction without being overlapped by the storage portions in a view in a direction along the vertical direction.

7. The container storage facility according to claim 3, wherein the storage portions are arranged side-by-side in a vertical direction so as to overlap each other in a view in a direction along the vertical direction, and the gas supply device is arranged lower than the storage portions in the vertical direction without being overlapped by the storage portions in a view in a direction along the vertical direction.

8. The container storage facility according to claim 4, wherein the storage portions are arranged side-by-side in a vertical direction so as to overlap each other in a view in a direction along the vertical direction, and the gas supply device is arranged lower than the storage portions in the vertical direction without being overlapped by the storage portions in a view in a direction along the vertical direction.

* * * * *